United States Patent [19]

Schweitzer, Jr.

[11] 4,438,403

[45] Mar. 20, 1984

[54] FAULT INDICATOR WITH COMBINED TRIP AND RESET WINDING

[76] Inventor: Edmund O. Schweitzer, Jr., 1002 Dundee Rd., Northbrook, Ill. 60118

[21] Appl. No.: 290,012

[22] Filed: Aug. 4, 1981

[51] Int. Cl.³ .................. G01R 19/14; G01R 31/02
[52] U.S. Cl. .................................. 324/133; 324/51; 340/664
[58] Field of Search .................. 324/133, 51, 127; 340/664

[56] References Cited

U.S. PATENT DOCUMENTS 3,906,477  9/1975  Schweitzer, Jr. ............ 324/133
3,991,366  11/1976  Schweitzer, Jr. ............ 324/133
4,034,360  7/1977  Schweitzer, Jr. ............ 324/133

Primary Examiner—Gerard R. Strecker
Assistant Examiner—Warren S. Edmonds
Attorney, Agent, or Firm—Lockwood, Dewey, Alex & Cummings

[57] ABSTRACT

A fault indicator for indicating the occurrence of a fault current in a power distribution system includes a test-point-mounted circuit module and a remotely-mounted indicator module. The indicator module incorporates a bidirectional magnetic winding and a magnetic indicating element having a magnetic state conditioned by energization of the winding. Upon the occurrence of a fault in the power system trip circuitry within the circuit module energizes the winding with current in one direction to condition the indicator element to a fault-indicating magnetic state. Upon restoration of current in the system, reset circuitry within the circuit module energizes the winding with current in the opposite direction to condition the indicator to a reset-indicating magnetic state. The use of currents of opposite direction in a single magnetic winding provides greater flux density at the indicating element, and enables the indicator module to be connected to the circuit module by means of a two conductor cable. Alternate embodiments of the invention, utilizing visual-type indicator modules and current-reset modules, are also shown.

17 Claims, 22 Drawing Figures

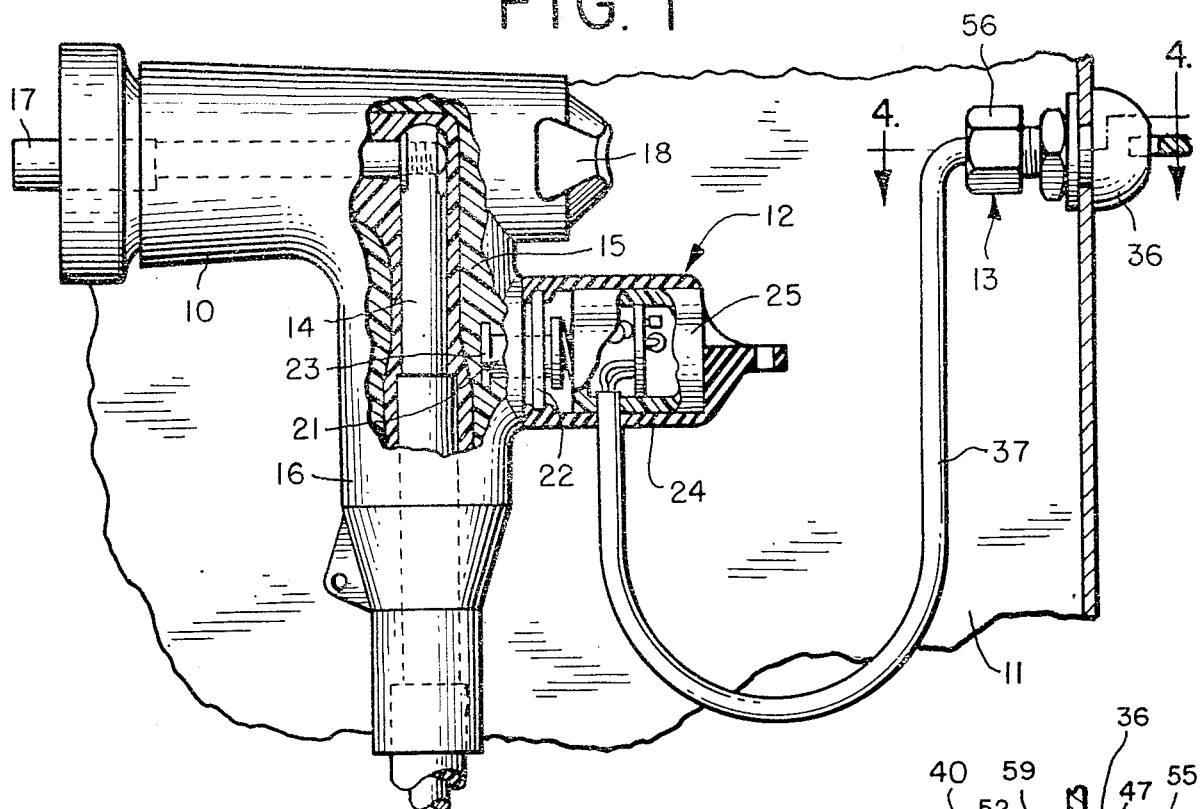
FIG. 1
FIG. 4
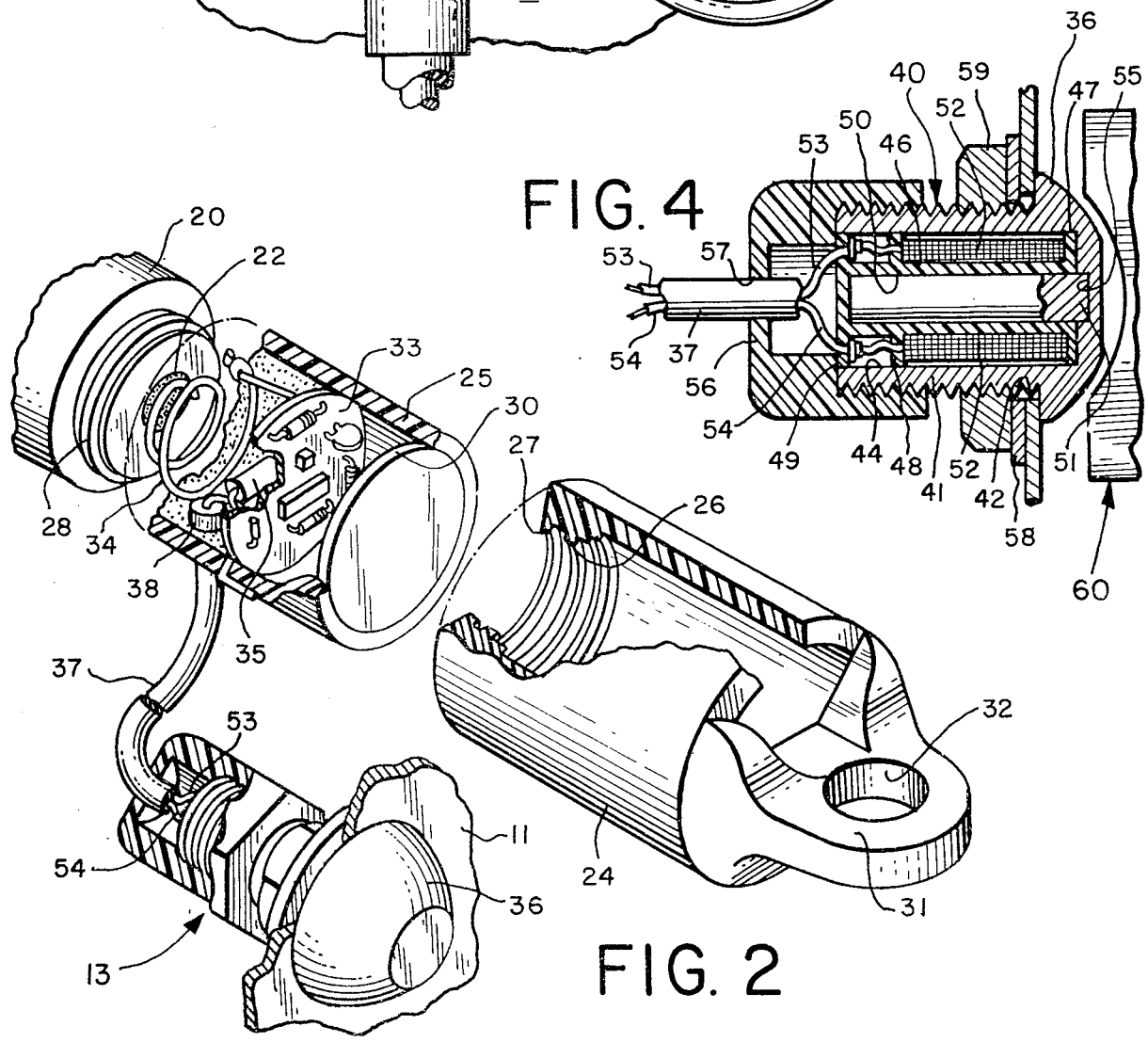
FIG. 2

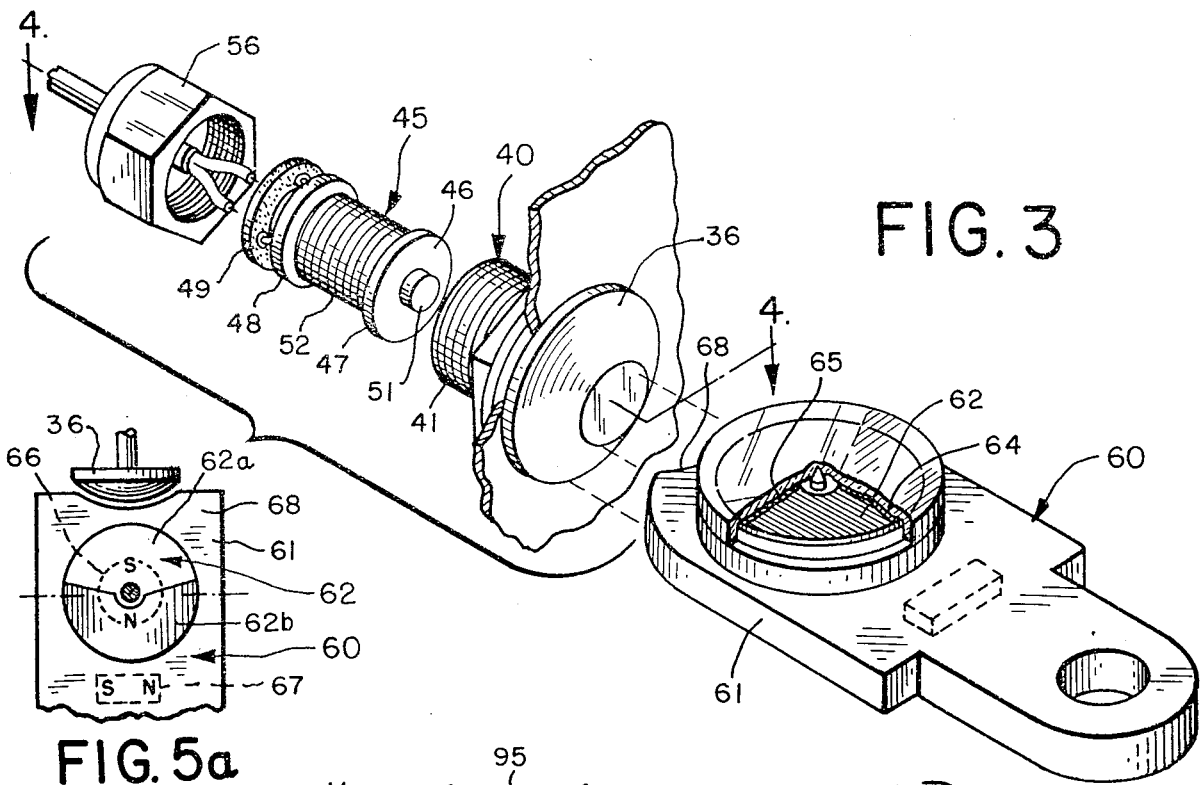
FIG. 3
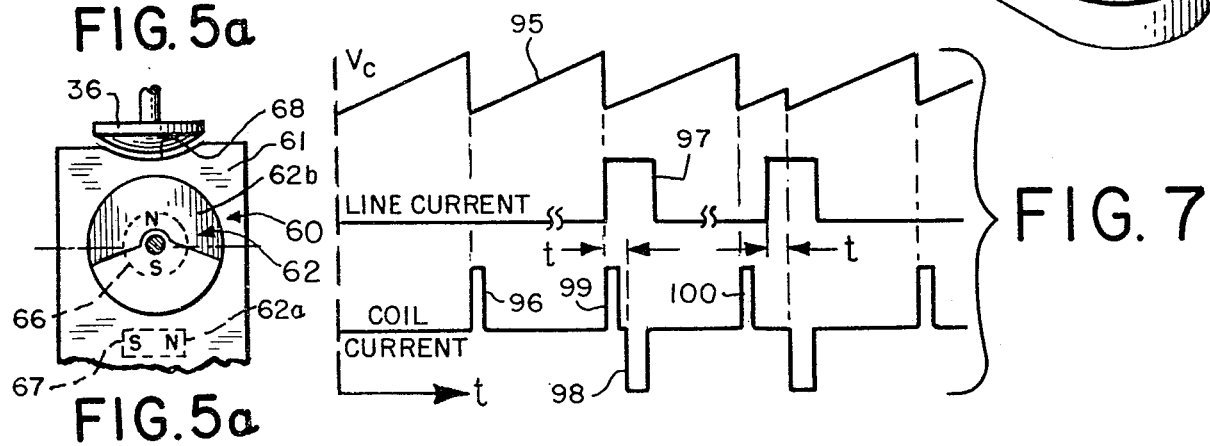
FIG. 5a
FIG. 5a
FIG. 7
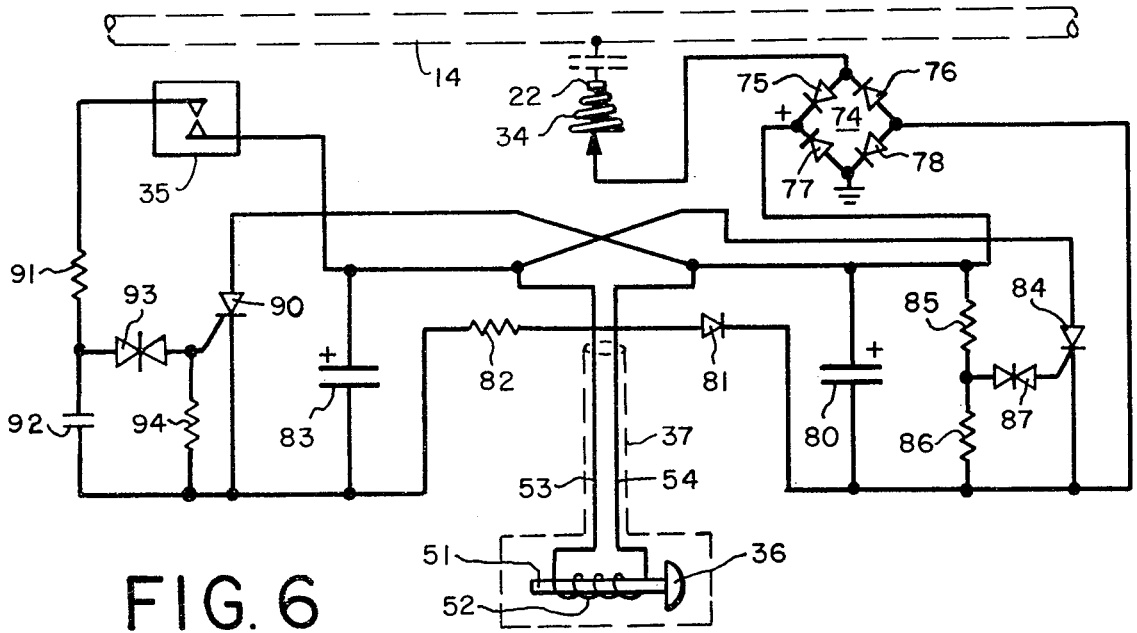
FIG. 6

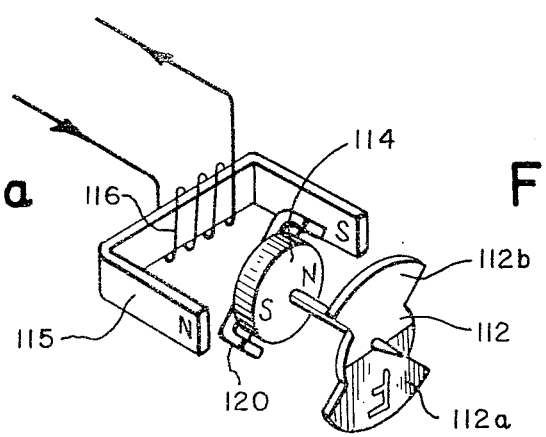
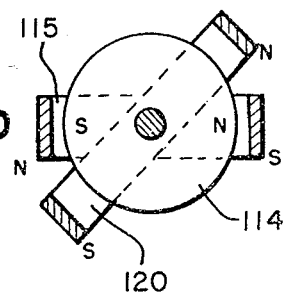
FIG.11a    FIG.11b
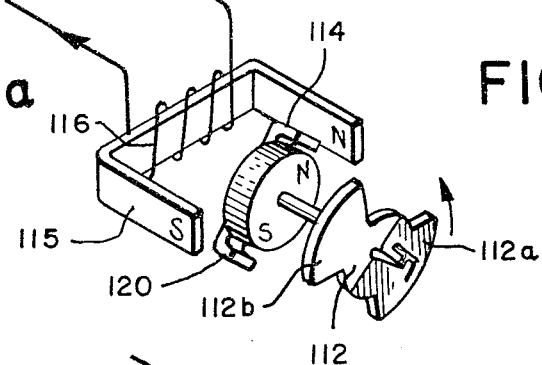
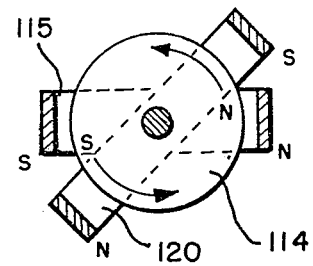
FIG.12a    FIG.12b
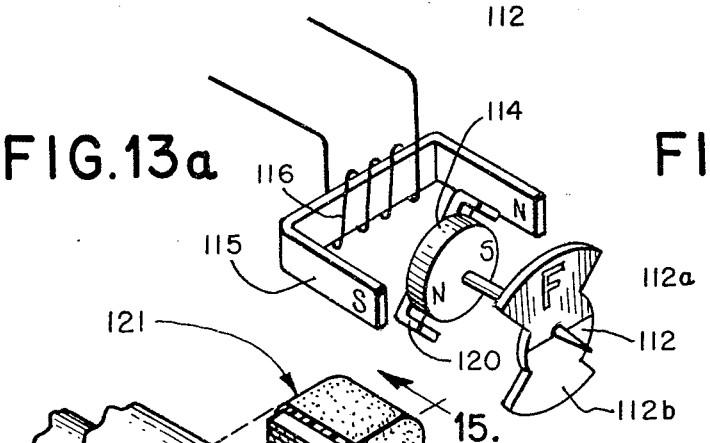
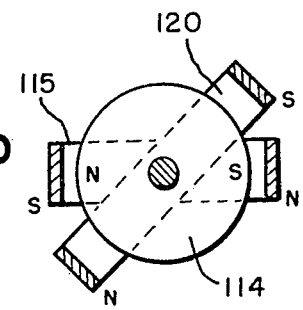
FIG.13a    FIG.13b
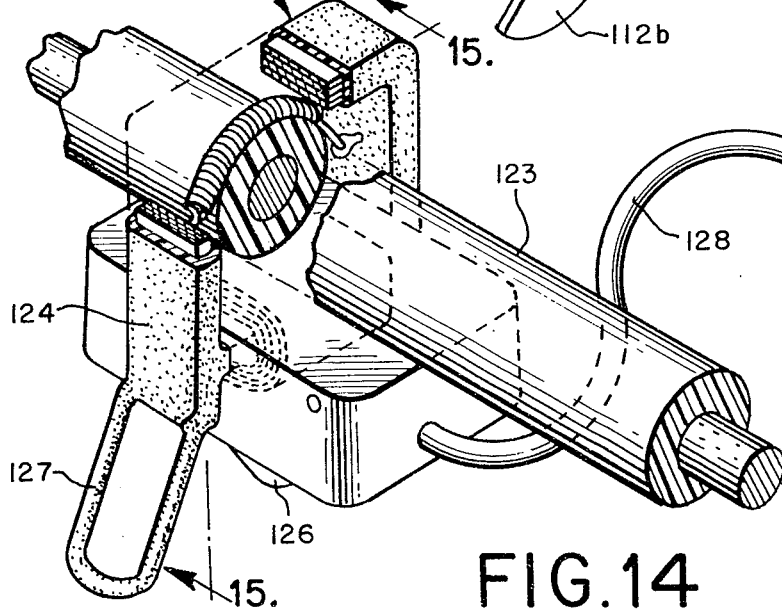
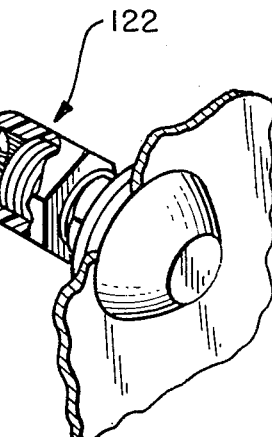
FIG.14

FAULT INDICATOR WITH COMBINED TRIP AND RESET WINDING

BACKGROUND OF THE INVENTION

The present invention relates generally to current sensing devices for electrical systems, and more particularly to automatically resettable alternating current fault indicators.

Various types of fault indicators have been constructed for detecting electrical faults in power distribution systems, including clamp-on type fault indicators, which clamp directly over cables in the systems, and test point type fault indicators, which are mounted over test points in cables or associated connectors of the systems. Such fault indicators may be either of the manually reset type, wherein it is necessary that the indicators be physically reset, or of the self-resetting type, wherein the indicators are reset upon restoration of line current. Examples of such fault indicators are found in products manufactured by E. O. Schweitzer Manufacturing Company of Mundelein, Ill., in U.S. Pat. No. 3,676,740, 3,906,477, 4,063,171 and 4,234,847 of the present inventor, and in the copending application of the present inventor; Fault Indicator with Magnetic Test Point, Ser. No. 103,042, filed Dec. 13, 1979.

Detection of fault currents in self-resetting fault indciators may be accomplished by means of magnetic switch means such as a magnetic reed switch in close proximity to the conductor being monitored. Upon occurrence of an abnormally high fault-associated magnetic field around the conductor, the switch means actuate a trip circuit which produces current flow in a trip winding to position a target indicator visible from the exterior of the indicator to a trip or fault indicating position. Upon restoration of current in the conductor, a reset circuit is actuated to produce current flow in a reset winding to reposition the target indicator to a reset or non-fault indicating position.

The present invention provides an improvement in such fault indicators, in that it provides a simplified circuit for use in conjunction with a single bidirectional magnetic winding in place of separate trip and reset windings. A prior art circuit which purported to provide such a single bidirectional magnetic winding is shown in U.S. Pat. No. 3,720,872 to Russell et al. However, this circuit provides fault indications on only one-half of the alternating current cycle, and therefore is not practical for many applications. In contrast, the invention provides fault indications on both halves of the alternating current cycle, and does not rely on reversal of line current to provide a reset current for its indicating mechanism.

The invention, because of its simplicity and compactness, is particularly attractive for use in remotely indicating fault indicators, such as are utilized in underground electrical distribution systems. In such systems, wherein primary and secondary feeder cables are directly buried in the ground and are brought to the surface only for connection to pad mounted distribution transformers or other system components, the need exists for economical remotely-indicating fault indicators which monitor both halves of the alternating current cycle and are suitable for installation within the above-ground metal enclosures typically utilized to house and protect the system components. Preferably, such fault indicators include a circuit module in magnetic communication with the monitored conductor, and an indicator module from which circuit status can be determined from the exterior of the enclosure without compromising the security provided to the power system components by the enclosure against vandalism or theft.

One successful remotely-indicating fault indicator, wherein circuit status is indicated by the magnetic sense of a remote magnetic test point module, is described in the previously identified copending application of the present application, Ser. No. 103,042. The present invention provides an improved circuit for this fault indicator, and for other remotely indicating fault indicators wherein a magnetic winding is utilized to selectively magnetize an indicating element, which reduces the size of the indicator module, and reduces the number of conductors required between the modules.

Accordingly, it is a general object of the present invention to provide a new and improved fault indicator.

It is a more specific object of the present invention to provide a new and improved remotely-indicating fault-indicator which is more compact and economical to produce.

SUMMARY OF THE INVENTION

A fault indicator for indicating the occurrence of a fault current in an electrical conductor includes a magnetic winding for producing a magnetic field in response to an applied current, the field being of one polarity in response to current applied to the winding in one direction, and of opposite polarity in response to current applied to the winding in the opposite direction. Status indicating means in magnetic communication with the magnetic winding assume a reset-indicating state in response to the occurrence of a magnetic field of the one polarity in the winding, and assume a fault-indicating state in response to the occurrence of magnetic field of the opposite polarity in the winding. Reset circuit means periodically produce a unidirectional current in the magnetic winding in the one direction whereby the status indicating means is conditioned to the reset state, and fault detecting circuit means responsive to the occurrence of a fault current in the conductor in either half of the alternating current cycle produce a unidirectional current in the magnetic winding in the opposite direction whereby the status indicating means is conditioned to the fault indicating state.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is an elevational view, partly in section, illustrating a remotely-indicating fault indicator incorporating the invention and having a test point- mounted circuit module and a remote magnetic indicator module.

FIG. 2 is an exploded perspective view of the principal components of the fault indicator of FIG. 1 with the circuit and indicator modules thereof partially in section to illustrate the internal construction of these modules.

FIG. 3 is an exploded perspective view of the remote indicator module of the fault indicator of FIG. 1, and of a circuit condition indicator tool in association therewith.

FIG. 4 is an enlarged cross-sectional view of the indicator module taken along line 4—4 of FIG. 3.

FIG. 5a is a diagrammatic view of the magnetic test point and circuit condition indicating tool of the fault indicator system in a reset state.

FIG. 5b is a diagrammatic view similar to FIG. 5a showing the fault indicator system in a tripped state.

FIG. 6 is an electrical schematic diagram of the fault indicator of FIG. 1.

FIG. 7 is a depiction of certain time, voltage and current relationships of the fault indicator useful in understanding the operation thereof.

FIGS. 11a and 11b are diagrammatic views of principal components of the indicator module of FIG. 9 in a reset state.

FIGS. 12a and 12b are diagrammatic views similar to FIGS. 11a and 11b, respectively, showing the principal components of the indicator module in transition between a reset state and a tripped state.

FIGS. 13a and 13b are diagrammatic views similar to FIGS. 11a and 11b, respectively, showing the principal component of the indicator module in a tripped state.

FIG. 14 is a perspective view, partially in section, of another alternate form of fault indicator incorporating the invention and having a conductor-mounted current-reset circuit module and a remote magnetic test point-type indicator module.

DESCRIPTION OF THE PREFERRED EMBODIMENT

Figure 8:
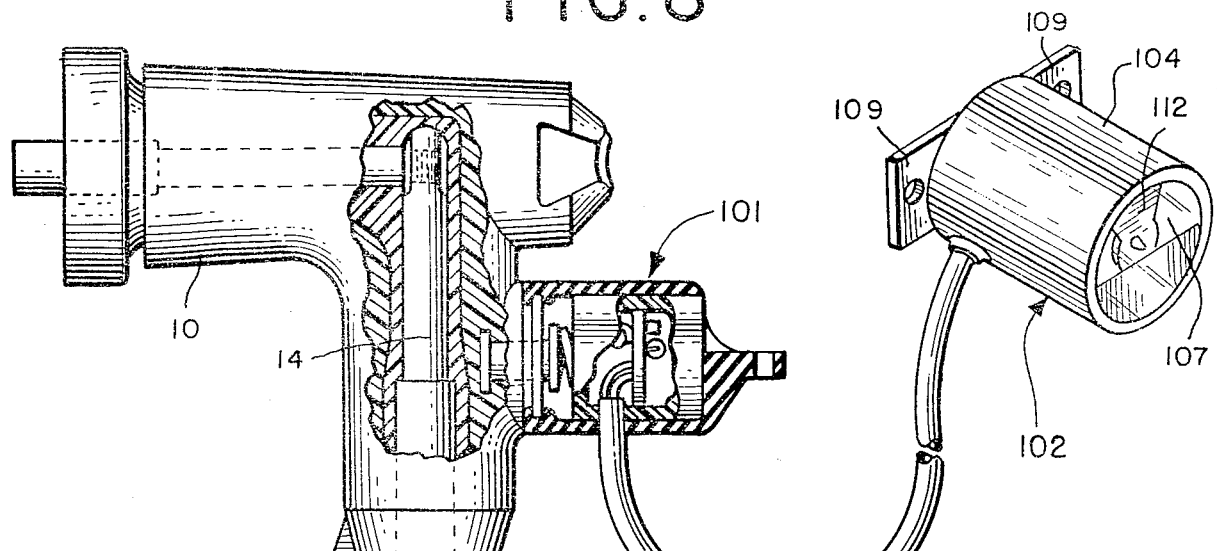
FIG. 8 is a perspective view, partially in section, of an alternate form of fault indicator incorporating the invention and having a visual-type indicating module.

Referring to the drawings, and particularly to FIG. 1, a remotely-indicating fault indicator system incorporating the invention is shown in conjunction with a plug-in elbow connector 10 of conventional construction for use in high voltage underground alternating current power systems. The elbow connector is installed on a transformer or other component of the system (not shown) which in accordance with conventional practice in such underground systems is pad-mounted above ground and enclosed within a tamper-proof weather-sealed protective housing 11. The purpose of the fault indicator system is to provide at the exterior of the housing an indication of the occurrence of a fault within the system, and to this end the fault indicator system includes a circuit module 12 fastened to a test point on the elbow connector, and an indicator module 13 providing an external magnetic test point by which the circuit status can be determined.

As shown, the elbow connector 10 includes generally an axial conductor 14 extending through an electrically insulating body portion 15 encased in an electrically-conductive rubber sheath 16, the sheath being grounded in accordance with conventional practice. An electrically conductive contact member 17 threaded at one end into an aperture in the end of conductor 14, extends from conductor 14 to mate with a complementary contact on the system component. An arcuate member 18 having ends anchored in the conductive sheath 16 extends from the connector to receive the hooked end of the lineman's tool commonly used to remove plug-in connectors from system components.

With reference also to FIG. 2, elbow connector 10 includes a test point terminal 20 on which the circuit module 12 is attached. In accordance with conventional practice, the test point connector is formed by a cylindrical portion of the insulating body portion 15 which projects radially through the conductive sheath 16. Embedded in the test point terminal 20 is an electrically conductive contact 21 having an annular outer flange portion 22 which is exposed at the outer end of the terminal to provide an electrical connection point, and an inner portion 23 in close proximity to conductor 14 to capacitively couple circuitry in circuit module 12 to the conductor.

Circuit module 12 is provided with a housing comprising an electrically-conductive semi-flexible rubber outer shell 24 which is generally cylindrical in form and open at one end for snap-over mounting to test point terminal 20. A correspondingly sized cylindrical housing 25 formed of plastic or other electrically non-conductive material is fitted within shell 24 to receive the electrical components of circuit module 12. Housing 25 may be held in position by an annular flange 26 on the inside surface of the shell. An additional annular flange 27 may be provided for engaging an annular flange 28 on test point 20 to secure the circuit module to the test point. The other end of cylindrical housing 25 is closed by means of an end cap 30 which is sonically welded to the housing.

When circuit module 12 is installed on test point terminal 20, the annular end flange 27 of shell 24 snaps over flange 28 to provide a tight weather-proof engagement between the two elements. The annular end flange 26 bears against the end of housing 25 to maintain the housing seated within shell 24. The outer surface of flange 27 engages the connector sheath 14 to make electrical contact with the sheath and thereby ground the shell. At the closed end of shell 24 a tab portion 31 having an aperture 32 therethrough is provided to facilitate removal of the circuit module from the test point with a conventional hooked lineman's tool (not shown).

To provide means for mounting the individual components of circuit module 12, a disc-shaped circuit board 33 is mounted within housing 25 perpendicular to the axis of the housing and in a location intermediate the ends thereof. Electrical contact is established between the electrical components mounted on circuit board 33 and test point contact 22 by means of a helical spring 34. To provide for sensing of a fault current in conductor 14, circuit module 12 includes a reed switch 35 mounted to the rear (as seen in FIG. 2) surface of circuit board 33. Upon occurrence of a fault this reed switch closes to energize circuitry in module 12 which conditions indicator module 13 to a fault indicating magnetic state.

Indicator module 13, which includes a magnetic test point 36 on the exterior surface of enclosure 11, is connected to circuit module 12 by a multiple conductor cable 37. Cable 37 enters housing 25 through an aperture 38 in the housing wall to provide for convenient connection between the conductors of the cable and the individual components mounted on circuit board 33.

Referring to FIGS. 3 and 4, the remote magnetic indicator module 13 comprises a bolt-shaped housing 40 formed of an aluminum alloy having low magnetic resistance and retention characteristics. The housing includes a threaded shank portion 41 which extends through an aperture 42 (FIG. 4) in the wall of enclosure. A rounded head portion of relatively larger diameter on the exterior end of the body member forms the magnetic test point 36 of the indicator module and prevents the housing from being pulled back into the enclosure through the aperture. The shank portion of housing 40 includes a bore-shaped recess 44 which extends along essentially the entire length of the housing, but does not extend through the head portion 36.

To provide means for inducing a magnetic state at magnetic test point 36, indicator module 13 includes within recess 44 a magnetic core assembly 45 (FIG. 3). As best seen in FIG. 4, core assembly 45 includes a generally cylindrical bobbin 46 formed of a non-conductive non-magnetic material such as plastic. The bobbin includes a single annular flange portion 47 at its forward end, a pair of parallel-spaced annular flange portions 48 and 49 at its other end, and an axially-aligned bore-shaped recess 50. A rod-shaped magnetic core member 51 formed of a material having a high magnetic retention characteristic, such as 3½ chrome magnet steel, is slidably received within recess 50 such that the forward end of the core member is brought into abutting engagement with the closed end of the recess adjacent head portion 36. An additional bore-shaped recess 55 of reduced diameter at the end of recess 44 may be provided to receive the end of the core member.

To provide means for magnetizing core member 51, bobbin assembly 45 includes, in accordance with the invention, a single untapped magnetic winding 52 wound on the bobbin between flange portions 47 and 48. This winding is connected to a pair of conductors 53 and 54 in cable 37 at connection points on flange portion 49 to facilitate energization by the circuitry of circuit module 12.

Core assembly 45 is retained in positive by an end cap 56 threaded over the end of shank portion 41. This end cap, which may be formed of a plastic material, includes an aperture 57 through which cable 37 is snuggly received. The entire indicator module 13 may be secured in position on the enclosure wall by means of a washer 58 and nut 59 threaded over the shank portion of housing 40.

On the occurrence of a fault current in conductor 14 during either half of the alternating current cycle, the magnetic test point 36 is magnetized to the magnetic polarity shown in FIG. 5b by momentary energization of winding 52 by a current in one direction. Magnetic test point 36 remains in this fault-indicating magnetic polarity until current is restored in the conductor and magnetic core 51 is remagnetized to the reset-indicating magnetic polarity shown in FIG. 5a by momentary energization of winding 52 by a current in the opposite direction.

To provide a visible indication to service personnel of the magnetic sense of magnetic test point 36, and hence the status of the monitored circuit, the fault indictator system includes a hand-held circuit status indicator tool 60. As shown in FIGS. 3, 4 and 5, indicator tool 60 includes a generally flat base 61 having an apertured handle portion at one end thereof. Adjacent the other end of the body, the indicator tool includes magnetic sensing means in the form of a rotatably mounted indicator disc 62. The face of disc 62 is divided into a reset-indicating white colored segment 62a and a fault-indicating red colored segment 62b. A raised transparent plastic cover 64 (FIG. 3) extends over the disc to form a sealed compartment within which the disc is free to turn. As opaque mask 65 on the inside surface of cover 64 allows only the top portion (as viewed in FIG. 5) of the disc to be visible to the user.

To render the position of disc 62 dependent on the magnetic polarity of magnetic test point 36, the disc includes about its pivot point an annular-shaped permanent magnet 66 having magnetic poles as shown in FIG. 5. In the absence of an external magnetic influence, such as that presented by magnetic test point 36, disc 62 is biased to an intermediate non-indicating position wherein both the white and red colored segments 62a and 62b are visible in generally equal proportions by means of a permanent magnet 67 mounted on base 61 along one edge of the disc. The poles of this magnet attract the poles of opposite polarity on magnet 66 with the result that the indicator rotates to and remains in the intermediate position.

When circuit status indicator tool 60 is placed adjacent to magnetic test point 36, as shown in FIG. 5, the stronger magnetic field provided by the magnetized core member 51 is sufficient to overcome the biasing force of magnet 67. In the event that core 51 is in a reset state, the external magnetic field generated by magnet 51 rotates disc 62 to its reset-indicating position, as shown in FIG. 5a. In the event core 51 is in a fault-indicating state, the magnetic field generated by magnet 51 rotates disc 62 to its fault-indicating position, as shown in FIG. 5b. A recess 68 may be provided on the end of the circuit status indicator tool body 61 to assist in alignment of the indicator with respect to the magnetic test point.

Energization of winding 52 by current in one direction upon occurrence of a fault current during either portion of the alternating current cycle in conductor 14, and energization of winding 52 by current in the opposite direction upon restoration of current in conductor 14, is accomplished by means of circuitry contained within circuit module 12. Referring to the schematic diagram shown in FIG. 6, the single untapped winding 52 of indicator module 13 is connected to the circuit module by conductors 53 and 54 of cable 37. Operating power for this winding is obtained by means of a bridge rectifier network 74 consisting of diodes 75–78. One input terminal of this network, formed at the juncture of the anode of diode 75 and the cathode of diode 76, is connected through helical spring 34 to test point contact 22. The other input terminal, formed at the anode of diode 77 and the cathode of diode 78, is connected to ground through the electrically conductive sheath 24 of the circuit module housing. With this arrangement, high voltage aternating current carried in conductor 14 is capacitively coupled to the bridge rectifier network, resulting in the production of a pulsating unidirectional current at the output terminals of the network.

The positive polarity output terminal of the bridge rectifier network, formed at the cathodes of diodes 75 and 77, is connected to one terminal of winding 52 through conductor 54, and to one terminal of a first capacitor 80. The negative polarity output terminal of the bridge rectifier network, formed at the juncture of the anodes of diodes 76 and 78, is connected to the remaining terminal of capacitor 80, and through a forward-biased diode 81 and a resistor 82 to one terminal of a second capacitor 83. The other terminal of capacitor 83 is connected to the remaining terminal of winding 52 through conductor 53. With this arrangement, capacitor 80 is charged directly, and capacitor 83 is charged through winding 52, diode 81 and resistor 82, by the pulsating unidirectional current developed by bridge rectifier network 74 during normal current flow in conductor 14.

To provide for periodic energization of reset winding 53 during normal current flow in conductor 14, the remaining end terminal of winding 52 is connected through a silicon controlled rectifier (SCR) 84 to the negative polarity terminal of capacitor 80. Periodic conduction through SCR 84 is obtained by connecting the gate electrode of that device to the positive polarity output terminal of bridge rectifier 74 through a voltage divider network comprising resistors 85 and 86 and a bilateral diode 87. SCR 84 is periodically triggered into conduction when the voltage developed across bilateral diode 87 as a result of capacitor 80 being charged by bridge rectifier 74 reaches the threshold level of the diode.

In operation, under normal current flow conditions, the voltage developed across capacitor 80 as the capacitor is charged by bridge rectifier network 74 progressively increases with time, until the threshold breakdown voltage of bilateral diode 87 is reached, at which time SCR 84 is triggered and capacitor 80 discharges through winding 52. This causes a current flow in a first direction in winding 52, with the result that a reset-indicating magnetic state is established in core 51.

Capacitor 83 is charged by bridge rectifier network 74 through diode 81 and winding 52. Diode 81 prevents capacitor 83 from being discharged through SCR 84 upon conduction of that device, leaving the capacitor available for energizing winding 52 in a reverse direction in response to a fault condition.

In practice, the breakdown voltage of bilateral diode 87 may be in the order of 34 volts, and the time required for that portion of the voltage across capacitor 80 applied by resistors 85 and 86 to reach this threshold level with a typical voltage level of 4,400 volts on conductor 14 may be approximately 4 minutes. The voltage level within conductor 14 is not critical to the operation of the reset circuit, and has only the effect of changing the repetition rate of the reset cycle.

Winding 52 is energized in a second and opposite direction upon occurrence of a fault current in conductor 14 by discharge of capacitor 83 through a second SCR 90 having its cathode connected to the negative polarity terminal of the capacitor, and its anode connected to the first end terminal of winding 52. Conduction is established through SCR 90 by closure of the contacts of reed switch 35, which is connected between the positive polarity terminal of capacitor 83 and the gate electrode of SCR 90 by a network comprising a resistor 91 and a capacitor 92, a bilateral diode 93, and a resistor 94. Reed switch 35 is positioned within housing 25 in sufficiently close proximity to conductor 14 such that the contacts of the switch close upon occurrence of a fault current in the conductor.

Upon occurrence of a fault, the positive polarity terminal of capacitor 83 is connected through the closed contacts of reed switch 35 and the circuit comprising resistors 91 and 94, bilateral diode 93, and capacitor 92 to the gate electrode of SCR 90, causing that device to be rendered conductive. This causes capacitor 83 to discharge through SCR 90, energizing winding 52 in the reverse direction. The resulting magnetic flux in core 51 reverses the magnetic sense of the core and causes magnetic test point 36 to assume the magnetic polarity indicative of a fault state.

To preclude the possibility of winding 52 being simultaneously actuated by currents of opposite direction by simultaneous conduction through SCR 90 and SCR 84, a predetermined time delay in conduction through SCR 90 may be provided following occurrence of a fault current in conductor 14. This is accomplished by resistor 91 and capacitor 92, which together form an RC time constant network in the gate circuit of SCR 90. Upon closure of the contacts of reed switch 35 it is necessary that capacitor 92 charge through resistor 91 to the threshold voltage of bilateral diode 93 before sufficient gate electrode current is supplied to SCR 90 to initiate conduction in that device. Resistor 94 serves in a conventional manner as a current drain path for the gate electrode.

The time delay provided is designed to insure that should a fault occur simultaneously with the periodic energization of winding 52 in a reset direction, capacitor 92 will have completely discharged through that winding prior to winding 52 being energized to signal the fault. In practice, with a 36 volt voltage level across capacitor 83 and a 20volt threshold voltage level for bilateral diode 93, the time delay may be in order of 180 microseconds, with a resistor 91 of 1,800 ohms and a capacitor 92 of 0.1 microfarads.

The time delay relationship can be seen by referring to the waveforms illustrated in FIG. 7. Under normal line current conditions it is seen that the voltage Vc developed across capacitor 80 as depicted by waveform 95 progressively increases until the threshold level of bilateral diode 87 is reached, at which time SCR 87 is rendered conductive and a reset current depicted by waveform 96 is repetively caused to flow through winding 52. Upon occurrence of a fault current in conductor 14, as depicted by waveform 97, winding 52 is energized in the opposite direction after a delay period "t", as shown by waveform 98. Should the fault current occur simultaneously with the reset pulse, as shown by reset waveform 99, capacitor 80 will have completely discharged in one direction through winding 52 prior to the winding being energized in the opposite direction by capacitor 83, as a result of the time delay period "t". This obviates the possibility of winding 52 being simultaneously energized in opposite directions, and the attendant consequence of no current flow through the winding and the core not assuming a fault-indicative magnetic sense. Typically, the reset current pulses supplied to winding 52 have a duration of approximately 20 microseconds, and fault currents existing in conductor 14 have a duration of approximately ¼ cycle, or approximately 4 milliseconds in a 60 hertz system.

Should a fault occur before the reset pulse, as illustrated by waveform 100, the then occurring reset cycle will be interrupted by discharge of capacitor 80 through diode 81, resistor 82, and SCR 90 so that no possibility exists of a reset pulse occurring simultaneously with the ensuing delayed trip pulse. Resistor 82 serves to limit current flow through diode 81 and SCR 90 during this discharge period. Upon discharge of capacitor 80 and 83, the reset cycle begins anew as SCR 90 again becomes nonconductive.

Thus, in operation winding 52 is supplied with unidirectional current in one direction from a first current storage device, capacitor 80, and in the opposite direction from a second storage device, capacitor 83. Capacitor 80 is connected to one terminal of the magnetic winding, and capacitor 83 is connected to the other terminal. A first switch device, SCR 84, periodically completes the discharge circuit for capacitor 80 to the opposite terminal of the winding during reset conditions. A second switch device, SCR 90, completes the discharge circuit for capacitor 83 to the opposite terminal of the winding upon the occurrence of a fault current.

The two current storage capacitors 80 and 83 are simultaneously charged by a charging circuit which includes the line-powered rectifier source 74. Capacitor 80 is charged directly and capacitor 83 is charged through winding 52, isolation diode 81 and resistor 82. Diode 81 provides isolation for the trip circuit upon operation of the reset circuit.

The invention may also be incorporated in a fault indicator system having a visual-type indicator module, such as the sytem shown in FIG. 8. This system includes a circuit module 101 and a remote indicator module 102, interconnected by a two conductor cable 103. As in the previously described embodiment of FIGS. 1–7, in use the circuit module is mounted on the test point of a conventional elbow connector 10. The indicator module 102 may be mounted at a remote location, such as on the wall of a protective enclosure.

Figure 9:
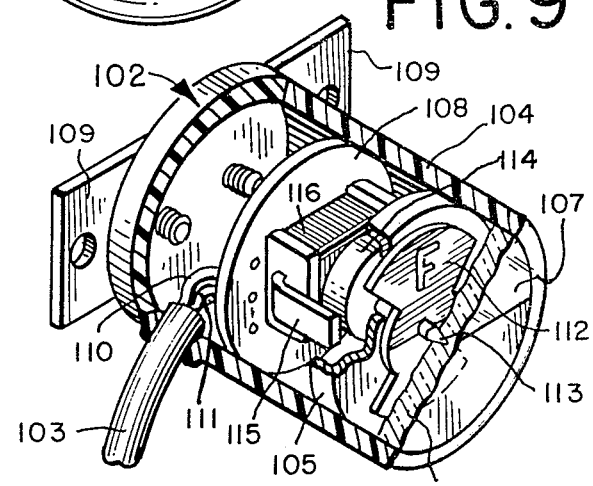
FIG. 9 is an enlarged perspective view of the indicator module of FIG. 8 partially in section to illustrate the internal construction of the module.

Referring to FIG. 9, indicator module 102 may include a cylindrical transparent plastic housing 104 within which the components of the module are contained. The module may be mounted by means of a flange 109 having apertures through which appropriate mounting hardware can be installed. Within the housing an integral partition 105 serves as a mask and spacing element, and a transparent end cap 106 sonically welded to the end of the housing seals the interior against contamination while providing a viewing window 107.

A disc-shaped circuit board 108 is positioned perpendicularly to the axis of the housing. This circuit board, which may be secured in position by an epoxy material filling the rear portion of the housing, serves as mounting means for the components of the fault indicator module. An electrical connection is established between the indicator module and the circuit module 101 by cable 103, which comprises two conductors 110 and 111.

To provide an indication of the occurrence of a ground fault current, the indicator module includes within the lower end of housing 104 a disc-shaped target indicator 112 mounted for rotation about a pivot point 113. As seen in FIGS. 11–13, the face of target indicator 112 has a red segment 112a and a white segment 112b, only one of which is visible at a time through window 107 in the transparent end of housing 104.

Secured to and pivotal with target disc 112 is a target permanent magnet 114, which is formed of a magnetic material having a high coercive force, such as ceramic, and is magnetically polarized to form two magnetic poles of opposite polarity, as indicated in FIGS. 11–13, with opposite magnetic polarities along a diameter of the magnet. The target disc 112 and its permanent magnet 114 are biased to the position shown in FIGS. 11a and 11b when the fault indicator is in a non-tripped or reset condition by means of a stationary generally U-shaped magnetic pole piece 115.

Pole piece 115, which is preferably formed of a magnetic material having a relatively low coercive force, such as a chrome steel, in the reset mode is biased at its projecting ends to the magnetic polarities indicated in FIGS. 11a and 11b. As shown in FIG. 1, the ends of the pole piece extend along the side wall of housing 104, in close proximity to target 112. As a result, the opposite polarity magnetic poles of the target magnet 114 are attracted to position the target disc 112 as shown. In this position the red segment 112a of the target disc is not visible through window 107, and all that is seen is the white segment 112b.

On the occurrence of a fault current in conductor 14, pole piece 115 is remagnetized to the magnetic polarities shown in FIGS. 12 and 13 by momentary energization in one direction of a single tapless winding 116 on the center section of the pole piece. As a result, the poles of magnet 114 are repelled by the adjacent like-polarity poles of the pole piece and target disc 112 is caused to rotate 180° to the tripped position shown in FIGS. 13a and 13b. In this position, the red segment 112a of the target disc is visible through window 107, and a lineman viewing the fault indicator is advised that a fault current has passed through conductor 14.

The target disc remains in the fault indicating position until the ends of pole piece 115 are subsequently remagnetized to the magnetic polarities shown in FIGS. 11a and 11b by momentary energization of winding 116 with a current in the opposite direction. As a result, the target magnet 114, and hence the target disc 112, is caused to rotate from the tripped position shown in FIGS. 13a and 13b to the reset position shown in FIGS. 11a and 11b, and the fault indicator is conditioned to respond to a subsequent fault current.

Energization of winding 116 in one direction upon occurrence of a fault current, and energization of winding 116 in the opposite direction upon subsequent clearing of the fault, is accomplished by means of circuitry within the circuit module. Referring to the schematic diagram shown in FIG. 14, this circuitry may be identical in structure and operation to that described in connection with the embodiment of FIGS. 1–7, the only difference being the use of pole piece-mounted winding 116 in place of bobbin-mounted winding 52. Accordingly, reference is made to the previous description for the structure and operation of the circuitry of the circuit module shown in FIG. 10.

To preclude target 112 from becoming installed upon reversal of the magnetic polarities of pole piece 115, as might happen with a target perfectly centered between the poles of the pole piece and having a degree of bearing friction, the fault indicator includes an auxiliary U-shaped pole piece 120 positioned adjacent target magnet 114 coaxial with and at an angle to pole piece 115. The existence of a magnetic field between the poles of pole piece 115 results in the production of induced magnetic poles of auxiliary pole piece 115. As a result, upon reversal of the magnetic polarity of the poles of pole piece 115 following occurrence of a fault current the auxiliary poles exert a rotational force on the most adjacent poles of the permanent rotor magnet 114 associated with target 112. This causes a rotational moment to be exerted on the target, tending to turn the target in a predetermined (counter-clockwise in FIGS. 11-13) direction such that the target is precluded from remaining in its reset position, even if it should be perfectly positioned and have a degree of bearing friction. Once rotation has been established, as shown in FIGS. 12a and 12b, the greater force of the main pole piece 115 overcomes the effect of the auxiliary pole piece 120 and rotation continues until the target is aligned as shown in FIGS. 13a and 13b.

Figure 15:
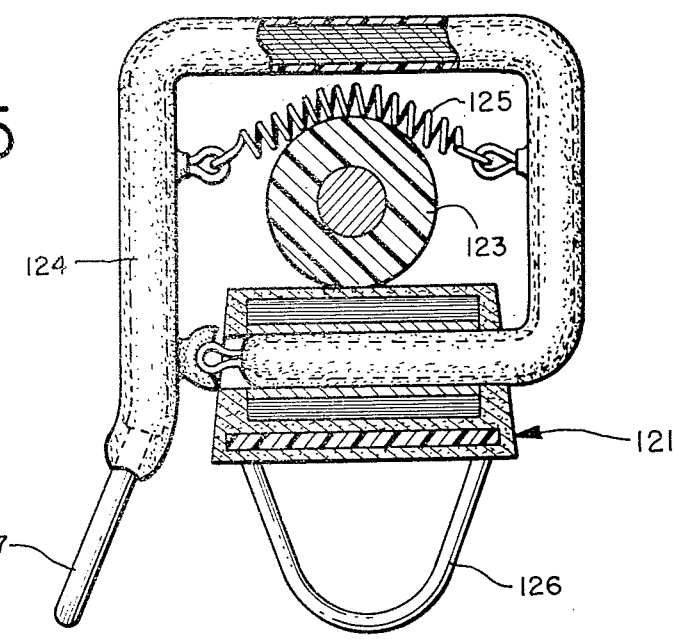
FIG. 15 is an enlarged cross-sectional view of the circuit module taken along lines 15—15 of FIG. 14.
Figure 16:
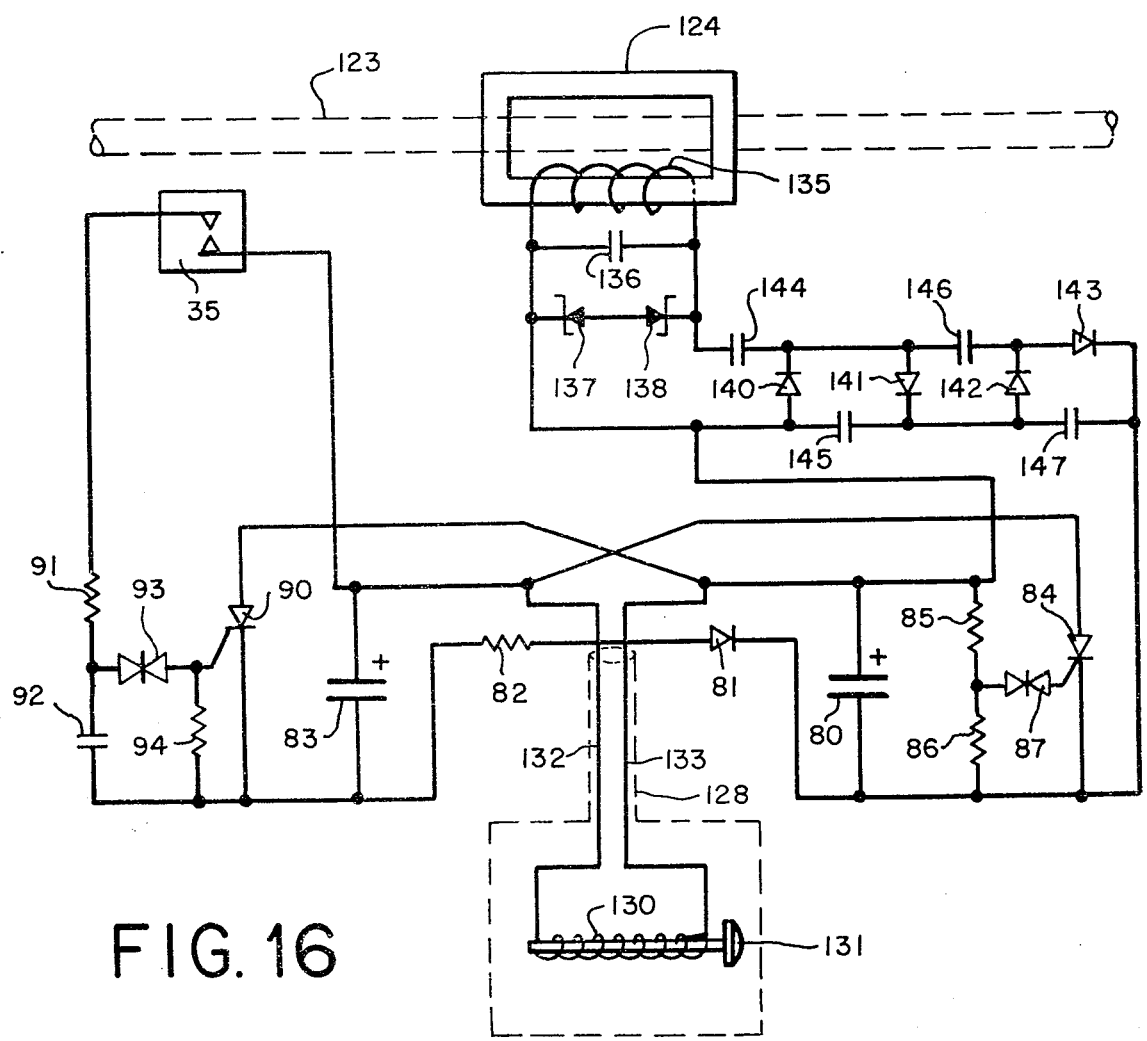
FIG. 16 is an electrical schematic diagram of the fault indicator of FIG. 14.

The invention may also be incorporated in a current-reset fault indicator system of the type intended for mounting on a monitored conductor, such as that shown in FIGS. 14-16. Basically, this system includes a circuit module 121 and an indicator module 122. The circuit module is mounted on a monitored conductor 123 by means of an integral magnetic pole piece 124 which fits around the conductor and is biased to a locked position by a spring 125 (FIGS. 14 and 15). A hook 126 molded into the circuit module housing and a hook 127 at the end of the pole piece facilitate installation and removal of the module from powered conductors by means of conventional lineman's tools. A cable 128 connects the two modules.

Indicator module 122 may be identical to module 13 of FIG. 1, and may similarly incorporate a single untapped winding 130 (FIG. 16) responsive to applied currents of opposite directions to generate a desired magnetic sense in an external magnetic test point 131. The ends of winding 130 are connected to the circuit module 121 by means of a pair of conductors 132 and 133 in cable 128.

Power for operation of the circuit module is obtained from a pick-up winding 135 within which an alternating current is induced as a consequence of the alternating current in conductor 123. The winding is tuned to resonance at the power line frequency by a capacitor 136 and the resultant resonant output signal is peak-limited by a pair of zener diodes 137 and 138 connected back-to-back across the winding.

The resonant signal is increased in voltage by a conventional voltage multiplier circuit comprising diodes 140-143 and capacitor 144-147 to develop in a manner well known to the art a direct current of sufficient magnitude for powering the circuitry of the module. To this end, the function of the current-powered power supply of FIG. 16 is identical to that of the bridge rectifier network 74 of FIG. 6.

The remaining circuitry of circuit module 121 is identical in form and function to that previously described in detail in connection with the embodiment of FIG. 1, and reference is made to the previous description for the operation of this circuit.

Figure 17:
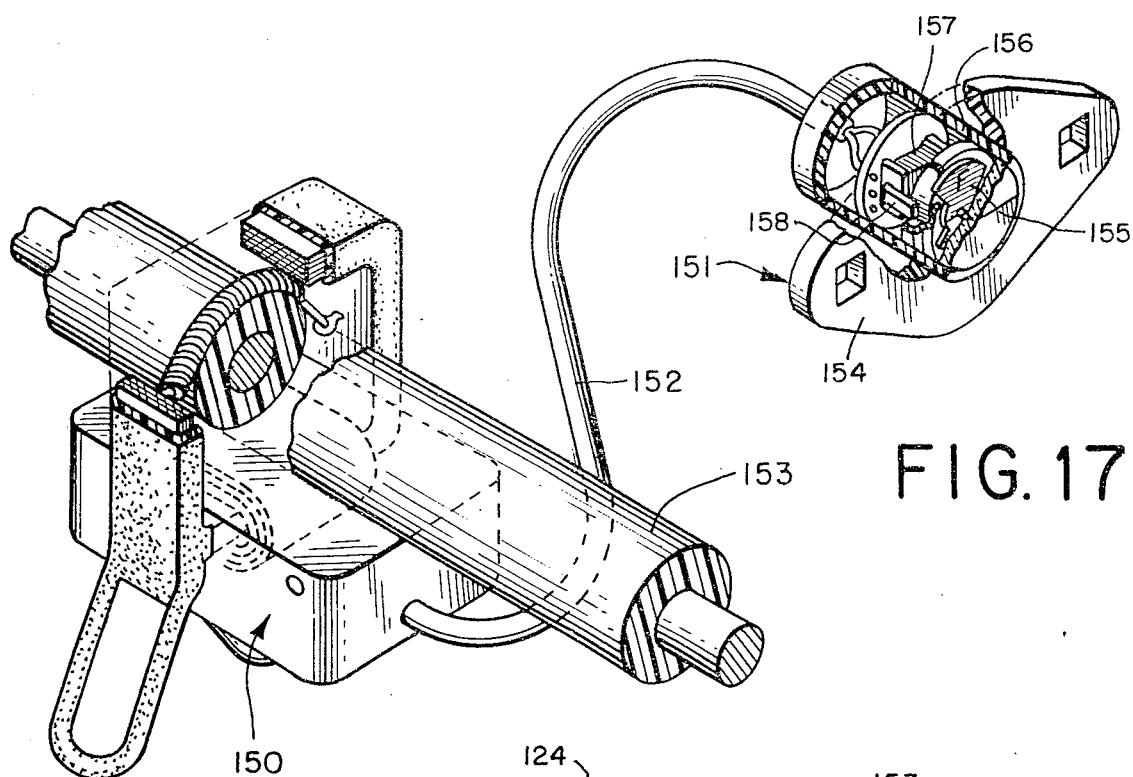
FIG. 17 is a perspective view, partially in section, of another alternate form of fault indicator incorporating the invention and having a conductor-mounted current-reset circuit module and a remote visual-type indicator module.
Figure 18:
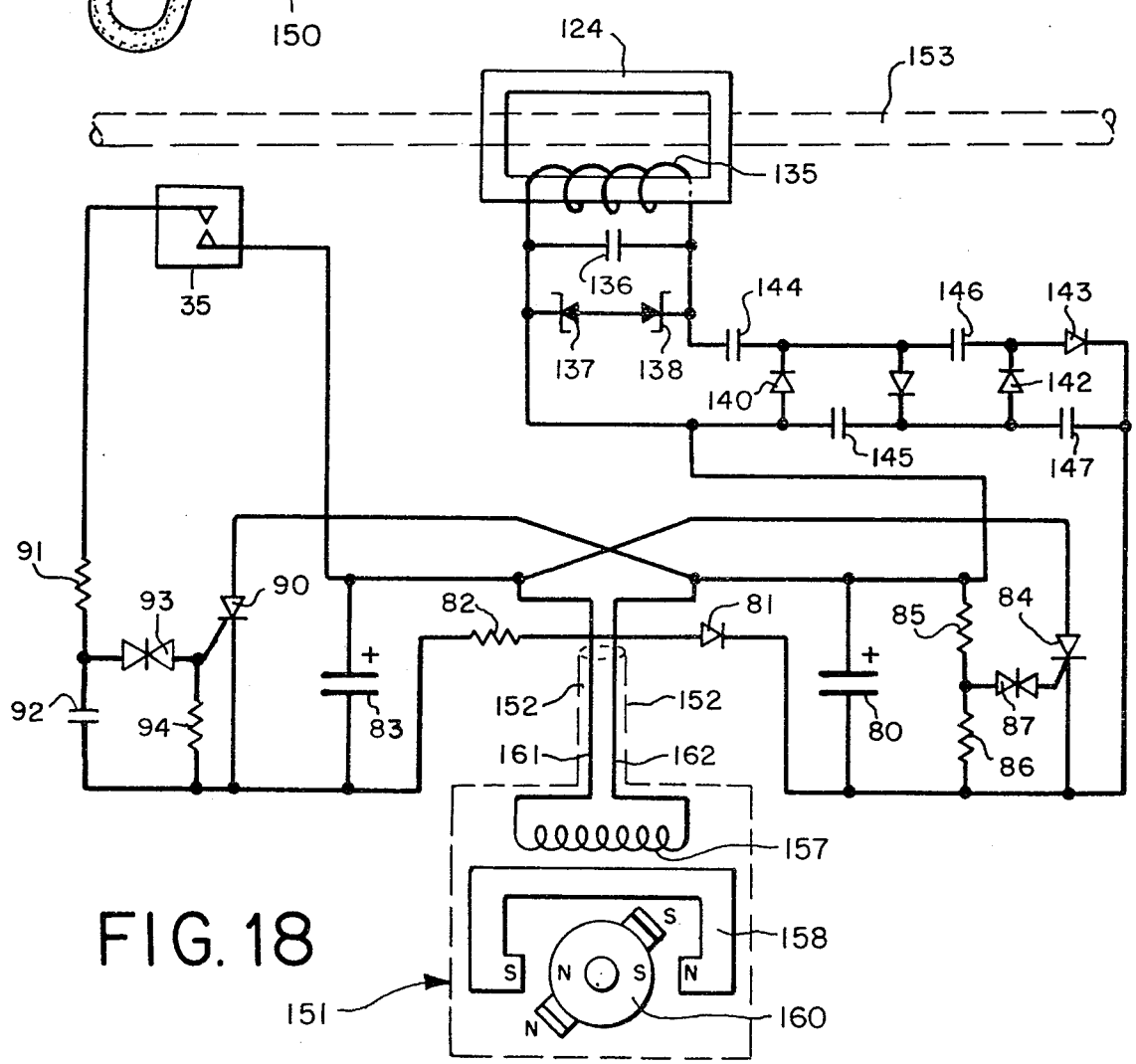
FIG. 18 is an electrical schematic diagram of the fault indicator of FIG. 17.

The invention can also be incorporated in a current-reset fault indicator system of the type having a visual-type indicating module, such as shown in FIG. 17. Basically, this system includes a circuit module 150, which may be similar to previously described circuit module 121, and a visual-type indicator module 151, which may be similar to previously described indicator module 102. The two modules are connected by a cable 152.

In use circuit module 150 is clamped over a conductor 153, and indicator module 151 is mounted on the side panel of an enclosure or other mounting surface by means of an integral flange portion 154. The occurrence of a fault is indicated by means of a rotatably mounted flag indicator disc 155, which is visible through a window in the indicator module housing 156. As in indicator module 102, the flag is positioned by means of a single magnetic winding 157 contained on a U-shaped magnetic pole piece 158, and an annular magnet 160 mounted for rotation with the target disc. Reference is made to the previous description of indicator module 102 for the construction and operation of indicator module 151.

Winding 157 of indicator module 151 is connected by a pair of conductors 161 and 162 in cable 152 to circuit module 150. Reference is made to the previous description of circuit module 121 for the construction and operation of circuit module 150.

The circuit of the invention, by obviating the need for separate trip and reset windings for magnetizing the magnetic test point, or for positioning the target indicator disc, in a fault indicator system responsive to fault currents occurring during either half of the alternating current cycle, enables the indicator module to be more compact and less complex to manufacture since only a single magnetic winding of fewer overall turns than the two windings of the prior art is required.

The smaller magnetic indicator winding made possible by the invention is particularly attractive in magnetic test point-type indicator modules, where it is desirable to have an indicator winding as small as possible and as close as possible to the exposed magnetic test point for maximum indicator efficiency. In one successful commercial embodiment of the invention, a single bidirectional winding consisting of 500 turns of No. 28 gauge wire was provided in a magnetic test point-type indicator module in place of reset and trip windings totaling 700 turns of No. 31 gauge wire, thereby significantly increasing the number of ampere-turns in the available space and the magnetic force available at the test point core.

Furthermore, the circuit of the invention enables the indicator and circuit modules to be interconnected by a two conductor cable, thereby achieving a cost and space savings over the three conductor cables heretofore required for this purpose. Moreover, since the circuit requires only two current storage capacitors and two switch devices, and the capacitors are charged through the indicator winding and a single isolation diode, the circuit is simple and economical to construct.

Figure 10:
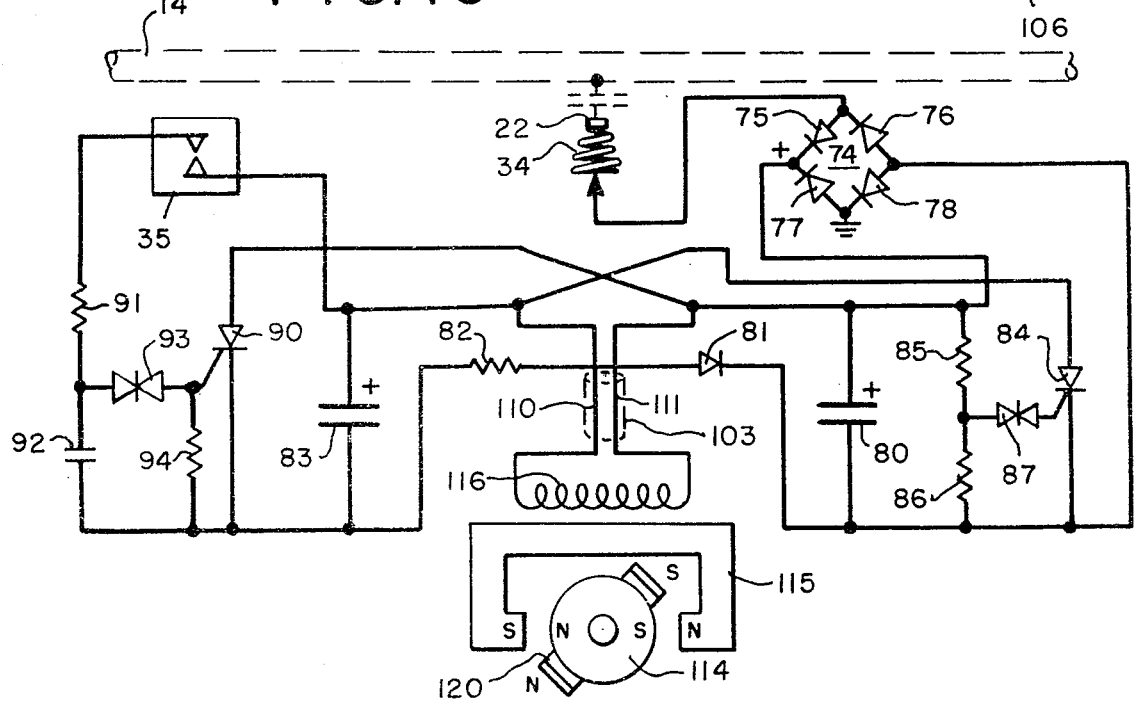
FIG. 10 is an electrical schematic diagram of the fault indicator of FIG. 8.

While the invention has been shown only in conjunction with fault indicator systems having remote indicator modules, it is contemplated that the simplified bidirectional winding construction and circuitry of the invention would also be of advantage in combined fault indicator systems, such as that shown in applicant's U.S. Pat. No. 4,234,847, where the fault detection and indication functions are accomplished in a single housing and compactness is a principal concern. A suitable circuit for such a combined system is shown in FIG. 10, the mechanism of the indicator module 102 being incorporated in the housing of circuit module 101.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for indicating the occurrence of a fault current in an electrical conductor of an alternating current distribution power system, comprising, in combination:

means including a magnetic winding having end terminals for producing a magnetic field in response to an applied current, said field being of one polarity in response to current applied to said winding in one direction between said end terminals, and of opposite polarity in response to current applied to said winding in the opposite direction between said end terminals;

status indicating means in magnetic communication with said magnetic winding, said status indicating means assuming a reset-indicating state in response to the occurrence of a magnetic field of said one polarity in the winding, and assuming a fault-indicating state in response to the occurrence of a magnetic field of said opposite polarity in said winding;

reset circuit means coupled to and operable from alternating current in the electrical conductor for developing a unidirectional current in said magnetic winding between said end terminals in said one direction whereby said status indicating means is conditioned to said reset state; and trip circuit means coupled to and operable from alternating current in the electric conductor and responsive to occurrence of a fault current in the conductor during either portion of the alternating current cycle for developing a unidirectional current in said magnetic winding between said end terminals in said opposite direction whereby said status indicating means is conditioned to said fault indicating state.

2. A fault indicator as defined in claim 1 wherein said status indicating means comprise a magnetizable core.

3. A fault indicator as defined in claim 1 having a housing, and wherein said status indicating means comprise a mechanical member visible from the exterior of said housing, said mechanical member having a first position corresponding to said reset state, and a second position corresponding to said fault-indicating state.

4. A fault indicator as defined in claim 1 wherein said reset circuit means includes a reset circuit current storage capacitor and said trip circuit means includes a trip circuit current storage capacitor, and wherein said unidirectional current in said one direction through said magnetic winding results from the discharge of said reset circuit current storage capacitor, and said unidirectional current in said other direction through said magnetic winding results from the discharge of said trip circuit current storage capacitor.

5. A fault indicator as defined in claim 4 wherein said reset circuit current storage capacitor is connected to one end terminal of said winding, said trip circuit current storage capacitor is connected to the other end terminal of said winding, said reset circuit means include switch means for discharging said fault circuit current storage capacitor through said winding between said end terminals in said one direction, and said trip circuit includes switch means for discharging said trip circuit current storage capacitor through said winding between said end terminals in said other direction.

6. A fault indicator as defined in claim 5 including charging circuit means for simultaneously charging said current storage capacitors from said source of unidirectional current.

7. A fault indicator as defined in claim 6 wherein said charging circuit means include circuit means connecting said reset circuit current storage capacitor to said source of unidirectional current, and a diode for connecting said trip circuit current storage capacitor to said reset circuit current storage capacitor whereby said trip circuit current storage capacitor is charged through said magnetic winding concurrently with said reset circuit current storage capacitor.

8. A fault indicator as defined in claim 1 having a first housing containing said circuit means, and a second housing containing said magnetic winding and said indicator means, and wherein said magnetic winding is connected to said circuit means by a single two conductor cable extending from said first housing to said second housing.

9. A fault indicator for indicating the presence of a fault current in an electrical conductor, comprising:

a source of unidirectional current coupled to and operable from alternating current in the electrical conductor;

a magnetic winding having first and second end terminals, said first terminal of said magnetic winding being connected to one output terminal of said unidirectional current source;

status indicating means in magnetic communication with said magnetic winding, said status indicating means assuming a reset-indicating state in response to the occurrence of a magnetic field of one polarity in said winding, and assuming a fault-indicating state in response to the occurrence of a magnetic field of the opposite polarity in said winding;

a first current storage capacitor, one terminal of said first current storage capacitor being connected to said first end terminal of said magnetic winding, and the other terminal of said first current storage capacitor being connected to the other output terminal of said unidirectional current source whereby said first current storage capacitor is charged by said current source;

a second current storage capacitor, one terminal of said second current storage capacitor being connected to said second end terminal of said magnetic winding, and the other terminal of said second current storage capacitor being connected to said other output terminal of said unidirectional current source through a diode whereby said second current storage capacitor is charged by said unidirectional current source through said magnetic winding and said diode;

first switch circuit means connected between said second end terminal of said magnetic winding and said other terminal of said first current storage capacitor for periodically discharging said first current storage capacitor through said magnetic winding to condition said indicating means to said reset-indicating state; and second switch circuit means connected between said first end terminal of said magnetic winding and said other terminal of said second current storage capacitor and responsive to the occurrence of a fault current in the conductor for discharging said second current storage capacitor through said magnetic winding to condition said status indicating means to said fault-indicating state.

10. A fault indicator as defined in claim 9 wherein said first and second switch means each comprise a silicon controlled rectifier.

11. A fault indicator as defined in claim 10 including reset circuit means operatively associated with said first switch mean for periodically actuating said first switch means to a conductive state to discharge said first current storage capacitor through said magnetic winding.

12. A fault indicator as defined in claim 11 including trip circuit means including a reed switch in magnetic communication with the conductor and operatively associated with said second switch means for actuating said second switch means to a conductive state upon the occurrence of a fault current to discharge said second current storage capacitor through said magnetic winding.

13. A fault indicator as defined in claim 9 wherein said status indicating means comprise a magnetizable core.

14. A fault indicator as defined in claim 10 wherein said status indicating means comprise a movable target member having fault and reset-indicating positions.

15. A fault indicator as defined in claim 9 wherein said magnetic winding is a single tapless winding.

16. A fault indicator as defined in claim 9 having a first housing containing said current storage capacitors and said switch circuit means, and a second housing containing said magnetic winding and said status indicating means, and wherein said magnetic winding is connected to said current storage capacitors and said switch circuit means by a single two conductor cable extending from said first housing to said second housing.

17. A fault indicator as defined in claim 1 wherein said reset circuit means and said trip circuit means includes a source of unidirectional current coupled to and operable from alternating current in the electrical conductor.

* * * * *